United States Patent
Fancher et al.

(10) Patent No.: US 12,038,465 B2
(45) Date of Patent: Jul. 16, 2024

(54) SELF-LOCKED RYDBERG ATOM ELECTRIC FIELD SENSOR

(71) Applicants: The MITRE Corporation, McLean, VA (US); The United States of America as Represented by the Secretary of the Army, Washington, DC (US)

(72) Inventors: Charlie Fancher, McLean, VA (US); Bonnie L. Marlow, McLean, VA (US); Kathryn Nicolich, McLean, VA (US); Kelly Backes, McLean, VA (US); Neel Malvania, McLean, VA (US); Kevin Christopher Cox, Gate City, VA (US); David Henry Meyer, Burtonsville, MD (US); Paul D. Kunz, Austin, TX (US); Joshua Cartwright Hill, Silver Spring, MD (US); William Knox Holland, Berkeley, CA (US)

(73) Assignees: The MITRE Corporation, McLean, VA (US); The United States of America as Represented by the Secretary of the Army, Washington, DC (US)

( * ) Notice: Subject to any disclaimer, the term of this patent is extended or adjusted under 35 U.S.C. 154(b) by 9 days.

(21) Appl. No.: 17/693,036

(22) Filed: Mar. 11, 2022

(65) Prior Publication Data
US 2023/0288465 A1    Sep. 14, 2023

(51) Int. Cl.
*G01R 29/08*    (2006.01)
*G01R 29/14*    (2006.01)

(52) U.S. Cl.
CPC ......... *G01R 29/0885* (2013.01); *G01R 29/14* (2013.01)

(58) Field of Classification Search
CPC ........................... G01R 29/0885; G01R 29/14
(Continued)

(56) References Cited

U.S. PATENT DOCUMENTS

| | | | | |
|---|---|---|---|---|
| 4,758,092 A | * | 7/1988 | Heinrich | G01R 31/308 356/365 |
| 5,041,779 A | * | 8/1991 | Hales | G01R 29/0885 356/519 |

(Continued)

FOREIGN PATENT DOCUMENTS

| | | | | |
|---|---|---|---|---|
| WO | WO-2017177234 A1 | * | 10/2017 | ............. G01N 27/60 |
| WO | WO-2021101611 A2 | * | 5/2021 | ......... G01R 29/0885 |

OTHER PUBLICATIONS

Bowie, Jason L., John C. Garrison, and Raymond Y. Chiao. "Stimulated Raman gain in a Λ-type atomic system with doubly excited transitions." Physical Review A 61.5 (2000): 053811. (Year: 2000).*

(Continued)

*Primary Examiner* — Christopher P McAndrew
(74) *Attorney, Agent, or Firm* — Morrison & Foerster LLP

(57) ABSTRACT

A system for automatically locking a control laser in a Rydberg atomic sensor may comprise an atomic vapor cell, a probe laser configured to excite the atoms in the atomic vapor cell to an intermediate energy state, and a control laser configured to excite the one or more atoms in the atomic vapor cell from the intermediate energy state to a higher energy state. The light generated by the control laser may be dithered at a pre-determined frequency. The system further comprises a photodiode configured to convert light received from the vapor cell into an electrical signal, a lock-in amplifier configured to generate an error signal based on the electrical signal received from the photo diode and a received reference oscillation frequency, and a servo con- (Continued)

figured to receive the generated error signal from the lock-in amplifier and adjust a frequency of the control laser based on the received error signal.

22 Claims, 9 Drawing Sheets

(58) Field of Classification Search
USPC .......................................................... 324/96
See application file for complete search history.

(56) References Cited

U.S. PATENT DOCUMENTS

| | | | | |
|---|---|---|---|---|
| 5,389,782 A | * | 2/1995 | Hilliard | H01Q 3/2676 343/703 |
| 7,233,608 B2 | | 6/2007 | Zemmouri et al. | |
| 2005/0207456 A1 | * | 9/2005 | Berberian | G04F 5/14 372/32 |
| 2020/0292606 A1 | * | 9/2020 | Holloway | G01R 29/0892 |
| 2021/0075184 A1 | | 3/2021 | Bohn et al. | |
| 2021/0088582 A1 | * | 3/2021 | Ravikumar | G01R 31/311 |
| 2021/0109010 A1 | * | 4/2021 | Ruster | G01R 29/0878 |
| 2021/0273398 A1 | | 9/2021 | Malcolm et al. | |

OTHER PUBLICATIONS

Yazicioglu, Refet Firat, et al. "A 200$\mu$ W eight-channel EEG acquisition ASIC for ambulatory EEG systems." IEEE Journal of Solid-State Circuits 43.12 (2008): 3025-3038. (Year: 2008).*

Abel et al. (Jan. 2009). "Laser frequency stabilization to excited state transitions using electromagnetically induced transparency in a cascade system," 4 pages.

Jiao et al., (2016). "Laser frequency locking based on Rydberg electromagnetically induced transparency," Chinese Physics B 25(5): 053201. 5 pages.

Puigibert., (Sep. 2012). "Laser frequency stabilization to excited Rydberg transitions using electromagnetically induced transparency," 11 pages.

Song et al., (Sep. 2018). "Field Distortion and Optimization of a Vapor Cell in Rydberg Atom-Based Radio-Frequency ElectricField Measurement," Sensors 2018, 3205.

* cited by examiner

SELF-LOCKED RYDBERG ATOM ELECTRIC FIELD SENSOR

FIELD

The present disclosure relates to stabilizing laser frequencies in systems employing multi-photon transitions in atoms, such as atomic electric field sensors using Rydberg atoms.

BACKGROUND

Systems employing multi-photon transitions in atoms have many applications and thus are the subject of ongoing research. Examples of such systems include quantum sensors and quantum computers. While these systems have a large number of potential applications, their use is often impractical due to high costs and a lack of portability.

An exemplary system that harnesses multi-photon transitions in atoms is the Rydberg atom electric field sensor. The Rydberg atom electric field sensor is an emerging technology that harnesses multiphoton transitions in atoms to detect electric fields. Atoms that have been excited to a high energy Rydberg state are highly sensitive to electric fields. This property of Rydberg atoms can be harnessed to create an electric field sensor that in many ways are superior to conventional electric field sensors. In addition to being highly accurate, these sensors have several desirable characteristics, including small physical size, broad frequency spectrum access, and broadband noise rejection and thus have potential applicability in fields such as communications, sensing, and metrology.

Rydberg atom electric field sensors, like other systems employing multi-photon transitions in atoms, rely on systems of lasers to excite atoms in a consistent and precise manner. In order to achieve the requirements for accurate and stable sensing, a Rydberg atom electric field sensor may need a consistent laser power source that can excite atoms to the Rydberg state. Consistency for the laser can mean that the laser delivers a fixed and precise power as well as a fixed and precise wavelength of light (i.e., frequency). However, often times when a laser emits light for an extended period of time, the frequency and the power delivered by the laser source can drift. This drift impacts the excitation of the atoms and, as a result, can negatively affect the performance of a device that uses the laser for instance to sense electric fields. This phenomenon can be especially problematic when a sensor includes more than one laser.

For instance, in the case of Rydberg atom electric field sensors, at least two lasers are required to drive multi-photon transitions to Rydberg states. One laser is a probe laser that excites atoms from a ground state to an intermediate excited state. The probe laser can be locked (i.e., have its wavelength fixed to a precise value with little to no drift) using well-known saturated absorption spectroscopy methods. Laser systems that are locked using standard spectroscopy methods are well understood and have been successfully miniaturized. The second laser is a control laser that excites atoms from the intermediate state to a higher energy Rydberg state. This laser often is required to operate at a wavelength that makes locking the control laser more challenging. Conventional methods for locking a control laser often require the use of external cavities. These cavities are often expensive and sensitive to vibrations or temperature changes, reducing the portability of Rydberg atom electric field sensors and thus are undesirable. What is needed is a solution for locking the control laser that doesn't require external cavities and can meet the portability and sensitivity requirements that would make a Rydberg sensor feasible for commercial and industrial use.

SUMMARY

The present disclosure is directed toward a Rydberg atom electric field sensor with simplified "self-locking" system and technique. In one or more examples, a Rydberg sensor can utilize a frequency dither with a feedback loop to lock the frequency of the control laser at a particular frequency. In one or more examples, the sensor can be configured to detect frequency drift in the laser and take corrective actions to ensure that the frequency of the laser remains constant over long or short durations of times. In one or more examples, the systems and methods described in this disclosure can use "self-locking" techniques that uses data from the probe laser to lock the control laser after the probe laser has interacted with the atoms to be excited. In one or more examples, the system and methods described herein can represent an improvement over conventional sensors because they lock the control laser frequency without requiring any external cavities, wavemeters, or additional optical equipment, thus increasing the portability of the sensors. Furthermore, these sensors are more efficient as, rather than sending a significant portion of the control laser power to a separate frequency locking module, all of the available laser power is used to excite atoms to a Rydberg state.

In one or more examples, a system for automatically locking a control laser in a Rydberg atomic sensor comprises: an atomic vapor cell configured to store one or more atoms, a first laser configured to excite the one or more atoms in the atomic vapor cell to a first energy state, a second laser configured to excite the one or more atoms in the atomic vapor cell from the first energy state to a second energy state, wherein the second energy state is higher than the first energy state, and wherein a laser light generated by the second laser is dithered at a pre-determined frequency, a photodiode configured to receive light from the atomic vapor cell and convert the received light into an electrical signal, a lock-in amplifier configured to receive the electrical signal from the photodiode, and configured to receive a reference oscillation frequency signal, wherein the lock-in amplifier generates an error signal based on the electrical signal received from the photodiode and the received reference oscillation frequency, and a servo configured to receive the generated error signal from the lock-in amplifier and adjust a frequency of the second laser based on the received error signal.

Optionally, the lock-in amplifier comprises: a multiplier configured to multiply the received electrical signal from the photodiode and the received oscillation frequency signal, and a filter configured to filter the output of the multiplier so as to generate the error signal;

Optionally, the lock-in amplifier is configured to generate a non-zero error signal if the received oscillation frequency signal and the predetermined frequency of the second laser dither are not equal to one another.

Optionally, the lock-in amplifier is configured to produce substantially no error signal if the received oscillation frequency signal and the predetermined frequency of the second laser dither are substantially equal to one another.

Optionally, the servo comprises: a proportional gain stage, wherein the proportional gain stage is configured amplify the received error signal by a predetermined factor, and an integral gain stage, wherein the integral gain stage is configured to integrate the received error signal over a predetermined time period.

Optionally, the servo comprises an adder configured to add an output of the proportional gain stage and an output of the integral gain stage and generate a control signal.

Optionally, the control signal generated by the servo is configured to adjust a frequency of the second laser based on a voltage of the control signal generated by the servo.

In one or more examples, a method for automatically locking a control laser in a Rydberg atomic sensor includes: directing light from a first laser to an atomic vapor cell configured to store one or more atoms, wherein the first laser is configured to excite the one or more atoms in the vapor cell to a first energy state, directing light from a second laser to the atomic vapor cell, wherein the second laser is configured to excite the one or more atoms in the atomic vapor cell from the first energy state to a second energy state, wherein the second energy state is higher than the first energy state, and wherein a laser light generated by the second laser is dithered at a pre-determined frequency, receiving light from the atomic vapor cell at a photodiode, wherein the photodiode is to configured receive light from the atomic vapor cell and convert the received light into an electrical signal, receiving the electrical signal generated by the photodiode at a lock-in amplifier configured to receive the electrical signal from the photodiode, and configured to receive a reference oscillation frequency signal, wherein the lock-in amplifier generates an error signal based on the electrical signal received from the photodiode and the received reference oscillation frequency; and adjusting a frequency of the second laser using a servo configured to receive the generated error signal from the lock-in amplifier and adjust the frequency of the second laser based on the received error signal.

Optionally, the lock-in amplifier comprises: a multiplier configured to multiply the received electrical signal from the photo diode and the received oscillation frequency signal, and a filter configured to filter the output of the multiplier so as to generate the error signal;

Optionally, the lock-in amplifier is configured to generate an error signal if the received oscillation frequency signal and the predetermined frequency of the second laser dither are not equal to one another.

Optionally, the lock-in amplifier is configured to produce substantially no error signal if the received oscillation frequency signal and the predetermined frequency of the second laser dither are substantially equal to one another.

Optionally, the servo comprises: a proportional gain stage, wherein the proportional gain stage is configured amplify the received error signal by a predetermined factor, and an integral gain stage, wherein the integral gain stage is configured to integrate the received error signal over a predetermined time period.

Optionally, the servo comprises an adder configured to add an output of the proportional gain stage and an output of the integral gain stage and generate a control signal.

Optionally, the control signal generated by the servo is configured to adjust a frequency of the second laser based on a voltage of the control signal generated by the servo.

In one or more examples, a non-transitory computer readable storage medium is provided storing one or more programs for automatically locking a control laser in a Rydberg atomic sensor, the programs for execution by one or more processors of an electronic device that when executed by the device, causes the device to: direct light from a first laser to an atomic vapor cell configured to store one or more atoms, wherein the first laser is configured to excite the one or more atoms in the vapor cell to a first energy state, direct light from a second laser to the atomic vapor cell, wherein the second laser is configured to excite the one or more atoms in the atomic vapor cell from the first energy state to a second energy state, wherein the second energy state is higher than the first energy state, and wherein a laser light generated by the second laser is dithered at a pre-determined frequency, receive light from the atomic vapor cell at a photodiode, wherein the photo diode is to configured receive light from the atomic vapor cell and convert the received light into an electrical signal, receive the electrical signal generated by the photodiode at a lock-in amplifier configured to receive the electrical signal from the photo diode, and configured to receive a reference oscillation frequency signal, wherein the lock-in amplifier generates an error signal based on the electrical signal received from the photo diode and the received reference oscillation frequency, and adjust a frequency of the second laser using a servo configured to receive the generated error signal from the lock-in amplifier and adjust the frequency of the second laser based on the received error signal.

Optionally, the lock-in amplifier comprises: a multiplier configured to multiply the received electrical signal from the photo diode and the received oscillation frequency signal, and a filter configured to filter the output of the multiplier so as to generate the error signal;

Optionally, the lock-in amplifier is configured to generate an error signal if the received oscillation frequency signal and the predetermined frequency of the second laser dither are not equal to one another.

Optionally, the lock-in amplifier is configured to produce substantially no error signal if the received oscillation frequency signal and the predetermined frequency of the second laser dither are substantially equal to one another.

Optionally, the servo comprises: a proportional gain stage, wherein the proportional gain stage is configured amplify the received error signal by a predetermined factor, and an integral gain stage, wherein the integral gain stage is configured to integrate the received error signal over a predetermined time period.

Optionally, the servo comprises an adder configured to add an output of the proportional gain stage and an output of the integral gain stage and generate a control signal.

Optionally, the control signal generated by the servo is configured to adjust a frequency of the second laser based on a voltage of the control signal generated by the servo.

BRIEF DESCRIPTION OF THE FIGURES

The invention will now be described, by way of example only, with reference to the accompanying drawings, in which.

DETAILED DESCRIPTION

Figure 1B:
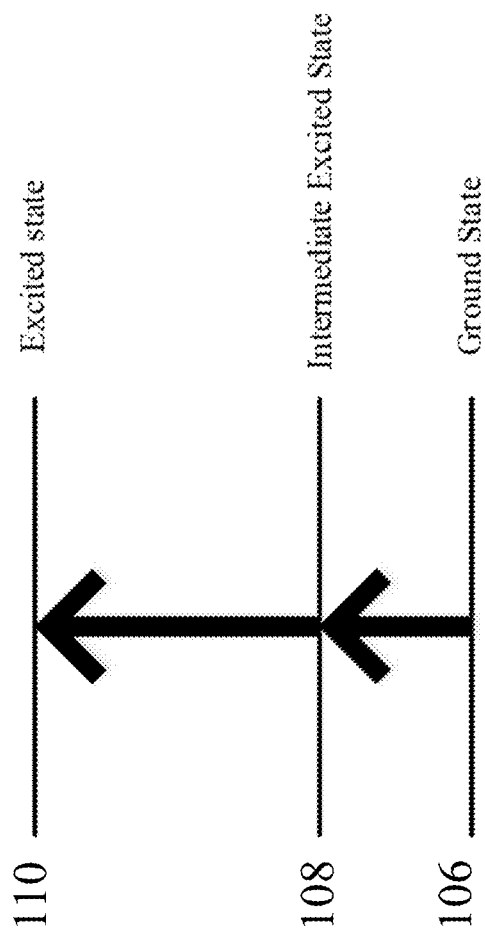
FIG. 1B illustrates an exemplary atomic energy level diagram according to examples of the disclosure.

The self-locking techniques described in the present disclosure are primarily described below with respect to Rydberg atom electric field sensors. These implementations are exemplary and should not be construed as limiting to the present disclosure. In one or more examples, the self-locking techniques may be implemented in systems employing multi-photon transitions in atoms or, more generally, in any application wherein it is necessary to lock the frequency of a laser.

In the absence of external energy, an atom will occupy its lowest-energy level, known as the ground state. If the atom absorbs energy, its energy level may increase to a higher energy excited state. A Rydberg atom is a large atom whose valence (i.e., outermost) electron(s) have been excited to a high energy (i.e., Rydberg) state. Among other interesting properties, Rydberg atoms display high sensitivity to electromagnetic fields. As such, in recent years, they have been used to develop small, highly accurate electric field sensors. Due to their size, accuracy, and insensitivity to noise, these sensors may be useful in a variety of areas. For example, Rydberg atom electric field sensors may be implemented in communications technologies to provide protection against electromagnetic pulses or in sensing technologies to improve the precision of radar or geolocation measurements.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Certain aspects of the present disclosure include process steps and instructions described herein in the form of an algorithm. It should be noted that the process steps and instructions of the present disclosure could be embodied in software, firmware, or hardware and, when embodied in software, could be downloaded to reside on and be operated from different platforms used by a variety of operating systems. Unless specifically stated otherwise as apparent from the following discussion, it is appreciated that, throughout the description, discussions utilizing terms such as "processing," "computing," "calculating," "determining," "displaying," "generating" or the like, refer to the action and processes of a computer system, or similar electronic computing device, that manipulates and transforms data represented as physical (electronic) quantities within the computer system memories or registers or other such information storage, transmission, or display devices.

The present disclosure in one or more examples also relates to a device for performing the operations herein. This device may be specially constructed for the required purposes, or it may comprise a general purpose computer selectively activated or reconfigured by a computer program stored in the computer. Such a computer program may be stored in a non-transitory, computer readable storage medium, such as, but not limited to, any type of disk, including floppy disks, USB flash drives, external hard drives, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each connected to a computer system bus. Furthermore, the computing systems referred to in the specification may include a single processor or may be architectures employing multiple processor designs, such as for performing different functions or for increased computing capability. Suitable processors include central processing units (CPUs), graphical processing units (GPUs), field programmable gate arrays (FPGAs), and ASICs.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present disclosure as described herein.

Figure 1A:
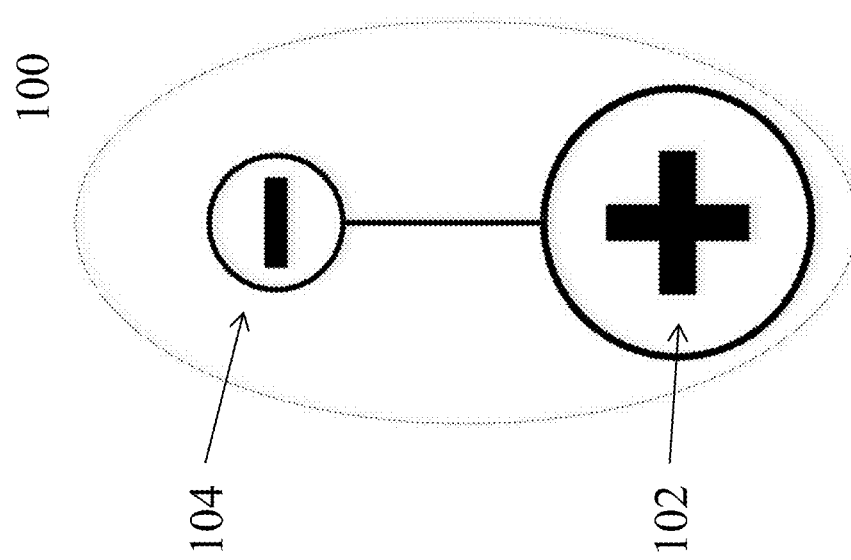
FIG. 1A illustrates exemplary properties of a Rydberg atom according to examples of the disclosure.

FIG. 1A illustrates exemplary properties of a Rydberg atom according to examples of the disclosure. In one or more examples, the example 100 of FIG. 1A can illustrate a Rydberg atom's positive core 102, which can include the atom's nucleus and inner (non-valence) electrons, and the excited valence electron 104. As mentioned above, Rydberg atoms are large as compared to most atoms; thus in the Rydberg state, the radius of excited valence electron 104's orbit about positive core 102 can be large. In one or more examples, this size can cause the Rydberg atom to behave like an electric dipole (i.e., a positive charge and a negative charge separated by a distance). In one or more examples, the energy levels of electric dipole having a large separation distance between its positive and negative charges can be perturbed in the presence of an external electric field. These perturbations can be detected by a laser and used to extract data about the electric field. This is the basic mechanism underlying atomic electric field sensors.

FIG. 1B illustrates an exemplary atomic energy level diagram according to examples of the disclosure. As illustrated in FIG. 1B, the atom can start in a ground state 106. This is the lowest-energy state that the atom can occupy. In one or more examples, external energy (e.g., from a laser) can be applied to the atom to excite a valence electron to an intermediate excited state 108. In one or more examples, once the atom is in intermediate excited state 108, external energy (e.g., from a second laser) can be applied to excite the valence electron to a higher energy Rydberg state 110. Once the atom has been excited to the Rydberg state, it can then be used to detect electric fields as described above.

In one or more examples, Rydberg atom electric field sensors typically have one or more chambers filled with atoms (usually in a gaseous form) that can be excited to a Rydberg state using one or more lasers. In one or more examples, the one or more lasers are directed into the chamber causing their light to impinge on the atoms in the chamber, and imparting energy on to the atoms in order to excite them to higher energy state. In one or more examples, exciting the atoms to a Rydberg state and then using the atoms to sense an electric field can require two separate lasers. In one or more examples, the first laser, called a probe laser, can excite the atoms in the chamber to an intermediate excited state. In one or more examples, the probe laser can also be used to detect energy perturbations in the atoms in the presence of external electric fields. In one or more examples, the second laser, called a control laser, can excite the atoms to a Rydberg state after the probe laser has excited them to an intermediate state. In one or more examples, tuning the frequency of the control laser can allow different Rydberg states to be achieved.

Figure 2:
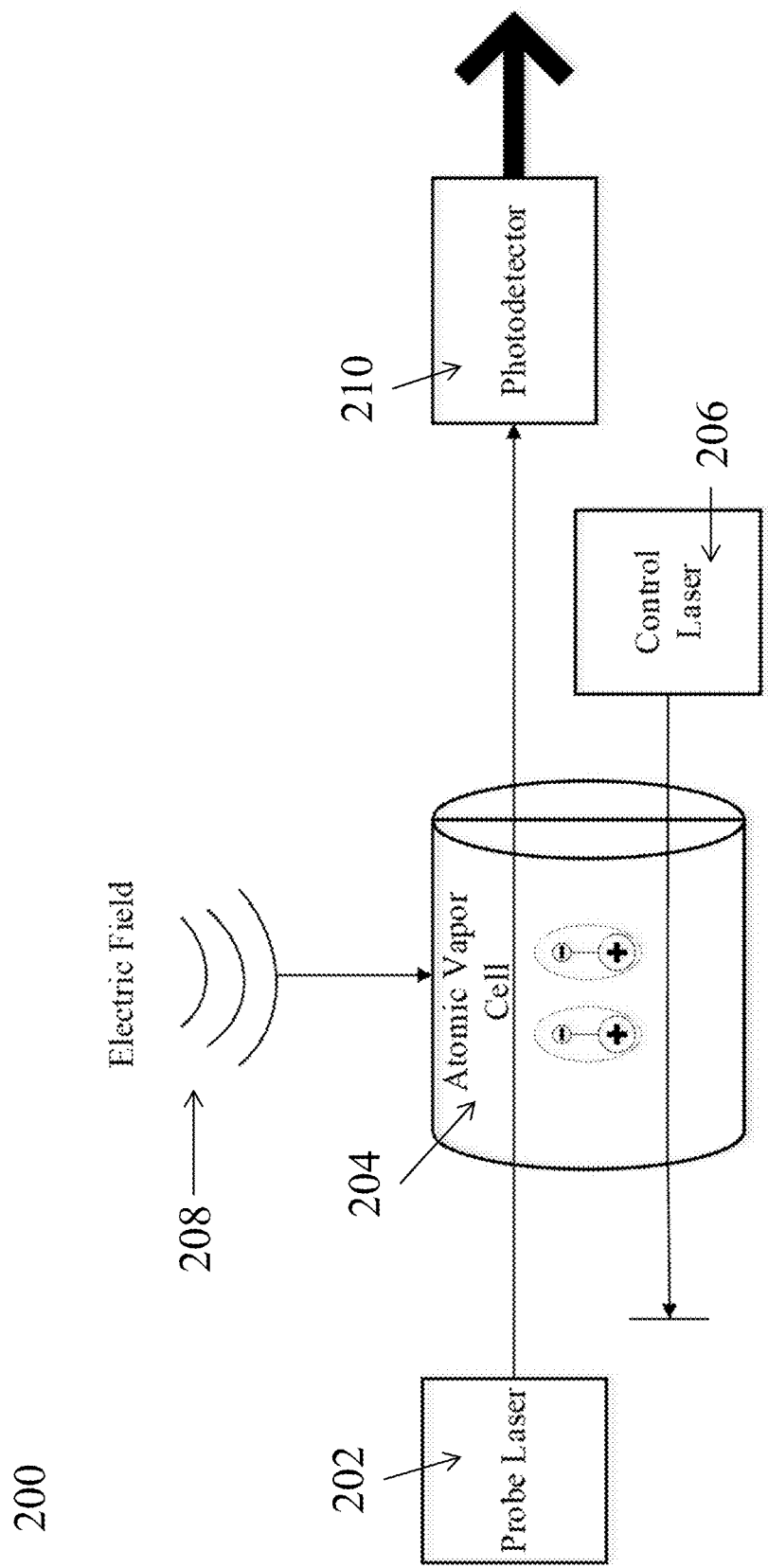
FIG. 2 illustrates an exemplary Rydberg atom electric field sensor according to examples of the disclosure.

FIG. 2 illustrates an exemplary standard Rydberg atom electric field sensor according to examples of the disclosure. The system 200 illustrated in FIG. 2 shows a diagram of a Rydberg atom electric field sensor comprising the components described above. Specifically, in one or more examples, sensor 200 can include a probe laser 202, an atomic vapor cell 204 (i.e., the chamber), a control laser 206, and a photodetector 210. In one or more examples, atomic vapor cell 204 comprises atoms which can be excited to a Rydberg state. In one or more examples, probe laser 202 can be configured to direct laser light to atomic vapor cell 204 so as to excite the atoms to an intermediate exited state. In one or more examples, once the atoms have been excited to the intermediate state, control laser 206 can be applied to atomic vapor cell 204 to excite the atoms to a chosen Rydberg state (based on the frequency of the laser). In one or more examples, the Rydberg state can be chosen by tuning the frequency of the control laser. In one or more examples, if sensor 200 is placed in an external electric field 208, the energy levels of the Rydberg atoms in atomic vapor cell 204 can shift due to the external electric field. In one or more examples, these shifts can perturb the frequency of the light from probe laser 202 and control laser 206. In one or more examples, these shifts can be used to detect properties of the electric field 208. In one or more examples, photodetector 210 may be situated such that the perturbed light from probe laser 202 is detected as it exits vapor cell 204. In one or more examples, photodetector 210 can be configured to specifically detect light at or approximately at the wavelength the probe laser 202. In one or more examples, spectral analysis of data from photodetector 210 can analyze the detected light and provide information about electric field 208.

In one or more examples, controlling the atoms' transitions between energy states can require precisely controlling the amount of energy that is applied to the atoms by the lasers. In one or more examples, the energy of light can be directly proportional to the light's frequency. While an ideal laser only emits light at a single, constant frequency, the frequency light emitted by a real-world laser will tend to drift if the laser is left on for an extended period of time. As such, in order to ensure that the atoms will remain in the desired excited states, it may be necessary to lock (i.e., stabilize) the frequency of the lasers to prevent frequency drift thereby improving the reliability and efficiency of the sensor.

Figure 3:
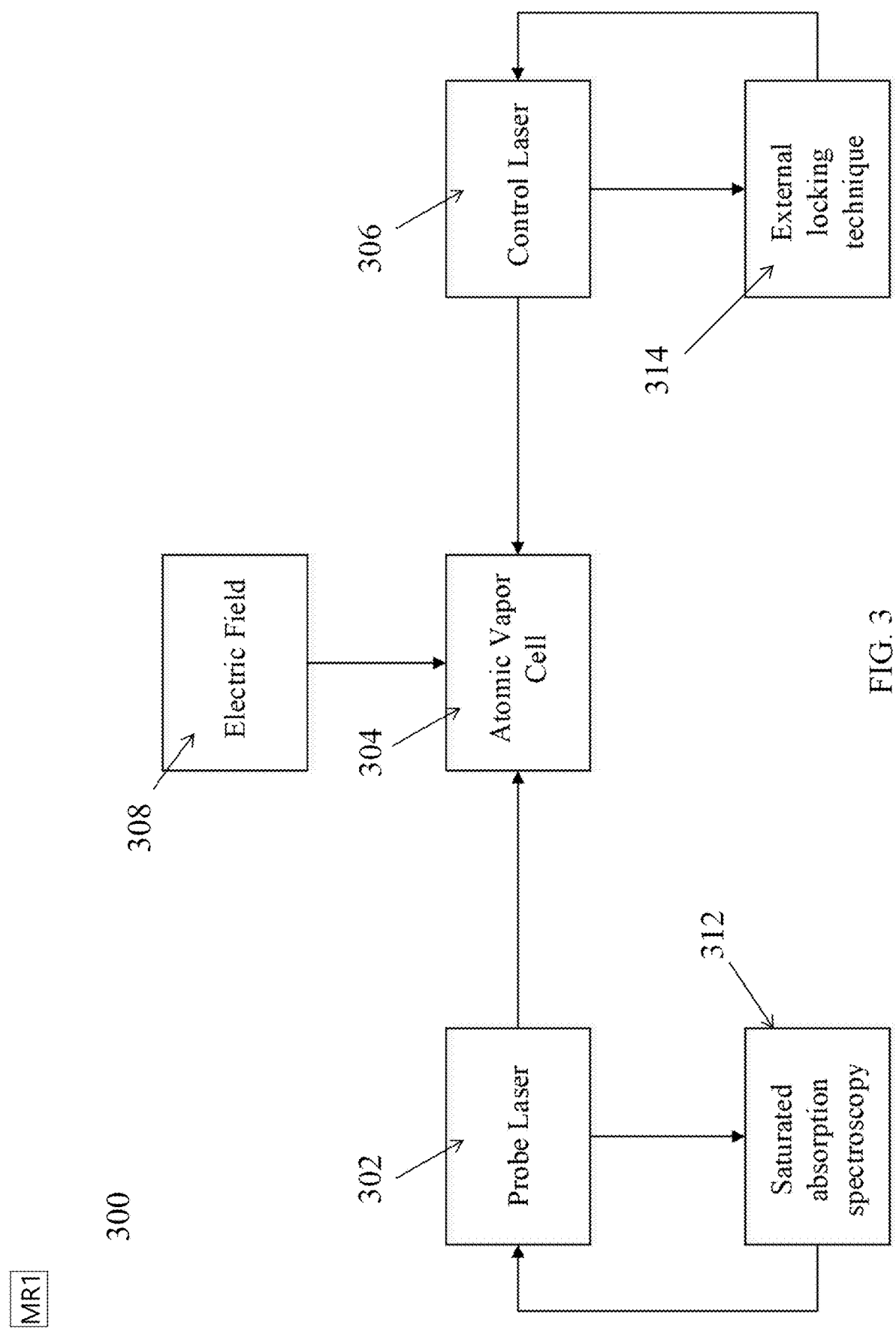
FIG. 3 illustrates another exemplary Rydberg atom electric field sensor.

FIG. 3 illustrates another exemplary standard Rydberg atom electric field sensor according to examples of the disclosure. In one or more examples, the Rydberg atom electric field sensor 300 illustrated in FIG. 3 includes one or more components that can be used to lock a control laser. In one or more examples, like the sensor 200 shown in FIG. 2, sensor 300 can include a probe laser 302, an atomic vapor cell 304, and a control laser 306. Thus, in one or more examples, the discussion of the components with respect to FIG. 2 can be referenced above for an explanation on the operation of those components. In one or more examples, sensor 300 may be used to detect external electric field 308 in substantially the same manner as the sensor 200 described above with respect to FIG. 2.

In one or more examples, the frequency of probe laser 302 can be stabilized using saturated absorption spectroscopy techniques 312. In one or more examples, these saturated absorption spectroscopy techniques 312 can include directing light from the laser through an atomic gas with a known absorption spectrum. In one or more examples, to lock probe laser 302 using such methods, light from probe laser 302 can be directed through an atomic gas in an atomic vapor cell. Since the temperature of atomic vapor cell 304 may need to be adjusted while sensor 300 is in use, the atomic vapor cell used to lock probe laser 302 may be separate from atomic vapor cell 304. In one or more examples, since the frequencies at which the atomic gas absorbs light are known to high precision, they can be used to stabilize the frequency of probe laser 302.

In one or more examples, stabilizing the frequency of control laser 306 can be more complicated than stabilizing the frequency of probe laser 302, since control laser 306 is applied after probe laser 302 has excited the atoms in atomic vapor cell 304 to an intermediate excited state (i.e., control laser 302 is not exciting the atoms from their ground state). In one or more examples, the saturated absorption spectroscopy methods used to lock probe laser 302 can rely on the ability to measure the absorption spectrum of the atomic gas in atomic vapor cell 304. In one or more examples, absorption spectrum data can be measured with a photodiode. However, in order to identify absorption data related to control laser 306, the intensity of control laser 302 may be extremely high, which would likely saturate the photodiode used to measure the data. In one or more examples, techniques other than saturated absorption spectroscopy can be used, as shown by control laser locking system 314. In one or more examples, control laser locking system may require an external cavity such as an ultra-low expansion cavity, a wavemeter, or a separation vapor cell for polarization-dependent locking. These cavities are generally expensive and/or highly sensitive to vibrations or temperature changes, reducing their portability.

Figure 4:
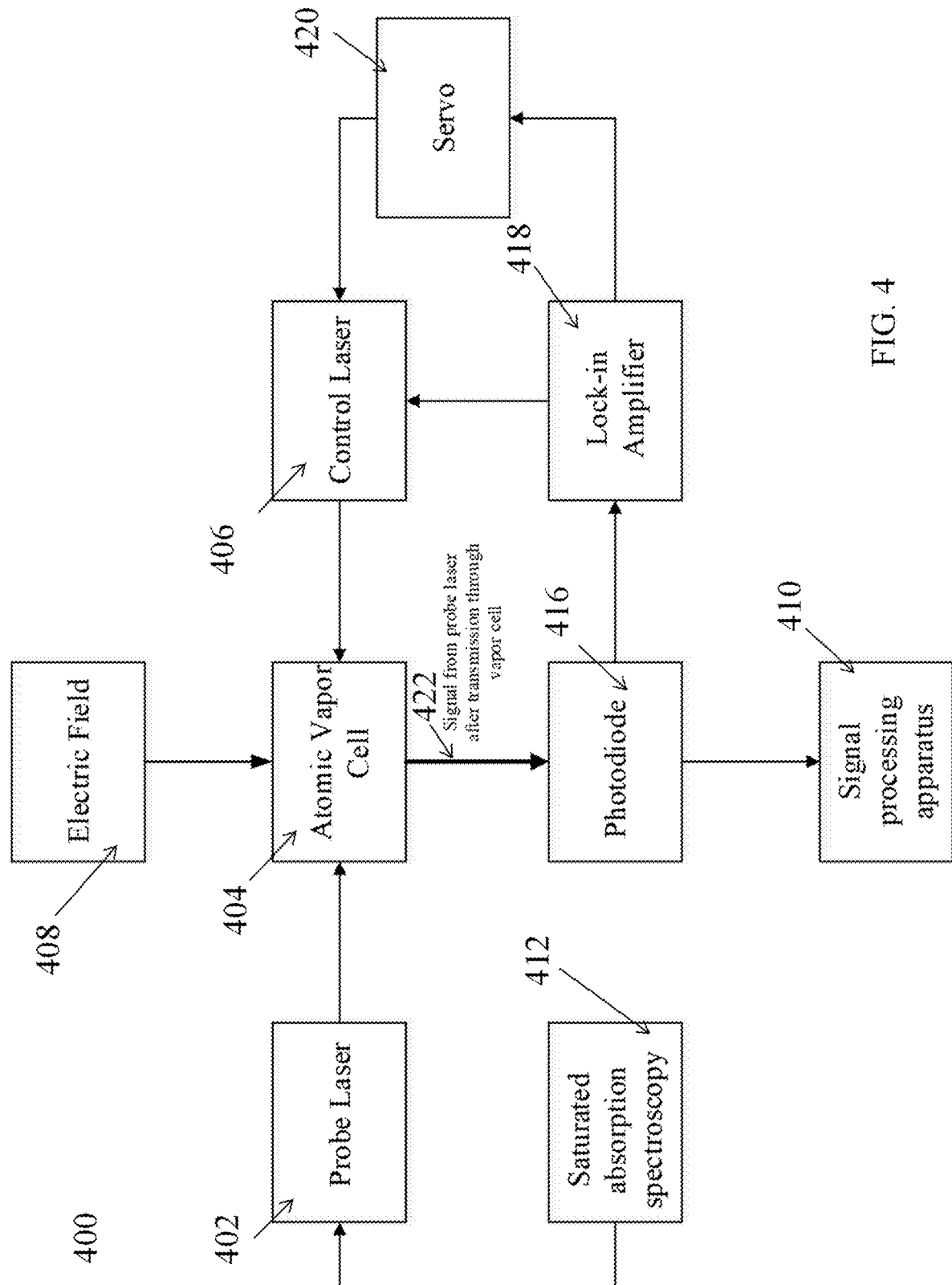
FIG. 4 illustrates a self-locking Rydberg atom electric field sensor according to one or more examples of the disclosure.

The Rydberg atom electric field sensors shown in FIG. 3 and FIG. 4 represent standard sensors that are known to people of ordinary skill in the art. As described above, these sensors may require external cavities, wavemeters, or separate vapor cells to lock their control lasers. In one or more examples of the disclosure, a self-locking technique may be provided which provides a stable laser frequency while also overcoming the issues associated with locking techniques that require an external cavity, wavemeter, or separate vapor cell. In one or more examples, the system and methods described below can allow all available laser power to be used in a single atomic vapor cell that is used to lock the lasers and to run the sensor. In one or more examples, the lack of external cavities, wavemeters, or additional optical components reduces the size, cost, and complexity of atomic electric field sensor, which, in turn, can increase their potential applications in a variety of fields.

FIG. 4 illustrates a self-locking Rydberg atom electric field sensor according to one or more examples of the disclosure. In one or more examples, self-locking sensor 400 of FIG. 4 comprises a probe laser 402, an atomic vapor cell 404, and a control laser 406 that are similar to their counterpart components in the example sensors 200 and 300 described above. In one or more examples, self-locking sensor 400 may be used to detect an external electric field 408. In one or more examples, self-locking sensor 400 may be used to detect electric fields. In one or more examples, self-locking sensor 400 may be used to detect electric fields within a certain bandwidth. Signals above or below this bandwidth may be detected using different techniques.

In one or more examples, atomic vapor cell 404 may be configured to house an atomic gas. In one or more examples, in order to be excited to a high-energy Rydberg state, the atoms in atomic vapor cell 404 may require a large atomic radius. As such, in one or more examples, atomic vapor cell 404 may be configured to house rubidium gas.

In one or more examples, probe laser 402 may be configured to excite atoms housed in atomic vapor cell 404 from a ground state to an intermediate excited state. In one or more examples, the frequency of light emitted by probe laser 402 may correspond with the energy that the atoms must absorb in order to be excited to the intermediate excited state. In one or more examples, probe laser 402 may be configured to emit light having a particular frequency. In one or more examples, the frequency of light emitted by probe laser 402 may be less than or equal to $3\times10^{20}$, $3\times10^{17}$, $3\times10^{13}$, $3\times10^{11}$, $3\times10^{7}$, $3\times10^{5}$, or $3\times10^{2}$ Hz. In one or more examples, the frequency of light emitted by probe laser 402 may be greater than or equal to $3\times10^{18}$, $3\times10^{15}$, $3\times10^{12}$, $3\times10^{9}$, $3\times10^{6}$, $3\times10^{3}$, or 3 Hz. In one or more examples, the frequency of light emitted by probe laser 402 may be between $0$-$3\times10^{2}$ Hz, $3\times10^{2}$ Hz-$3\times10^{6}$, $3\times10^{6}$-$3\times10^{9}$, $3\times10^{9}$-$3\times10^{12}$, $3\times10^{12}$-$3\times10^{17}$, or $3\times10^{17}$-$3\times10^{20}$ Hz.

In one or more examples, the frequency of light emitted by probe laser 402 may drift over time. In one or more examples, like probe laser 302 of FIG. 3, probe laser 402 may be locked using standard saturated absorption spectroscopy techniques, as indicated by probe laser locking mechanism 412. In one or more examples, light from probe laser 402 may be directed through atomic vapor cell 404. The atomic gas that is housed in atomic vapor cell 404 can absorb light at known frequencies. In one or more examples, the absorption spectrum of the atomic gas can be measured by a photodiode. Probe laser locking mechanism 412 may use data associated with the absorption spectrum of the atomic gas to adjust and stabilize the frequency of light emitted by probe laser 402.

In one or more examples, control laser 406 may be configured to excite atoms housed in atomic vapor cell 404 from an intermediate excited state to a higher energy Rydberg state. The frequency of light emitted by control laser 406 may correspond with the energy that the atoms must absorb in order to be excited to the Rydberg state. In one or more examples, the frequency of light emitted by control laser 406 may be less than or equal to $3\times10^{20}$, $3\times10^{17}$, $3\times10^{13}$, $3\times10^{11}$, $3\times10^{7}$, $3\times10^{5}$, or $3\times10^{2}$ Hz. In one or more examples, the frequency of light emitted by control laser 406 may be greater than or equal to $3\times10^{18}$, $3\times10^{15}$, $3\times10^{12}$, $3\times10^{9}$, $3\times10^{6}$, $3\times10^{3}$, or 3 Hz. In one or more examples, the frequency of light emitted by control laser 406 may be between $0$-$3\times10^{2}$ Hz, $3\times10^{2}$ Hz-$3\times10^{6}$, $3\times10^{6}$-$3\times10^{9}$, $3\times10^{9}$-$3\times10^{12}$, $3\times10^{12}$-$3\times10^{17}$, or $3\times10^{17}$-$3\times10^{20}$ Hz.

In one or more examples, the frequency of light emitted by control laser 406, like that of the light emitted by probe laser 402, may drift over time. In order to combat this drift, in one or more examples, sensor 400 can include a self-locking mechanism that stabilizes the frequency of light emitted by control laser 406 without the use of external apparatuses. In one or more examples, specifically, the self-locking mechanism uses an electrical signal generated based on light from probe laser 402 to lock the frequency of control laser 406. As shown, the self-locking mechanism may comprise a photodiode 416, a lock-in amplifier 418, and a servo 420, each of which are described in further detail below.

In one or more examples, after the atoms housed by atomic vapor cell 404 have been excited to an intermediate state by probe laser 402, light from control laser 406 may be directed through atomic vapor cell 404 so that light from both probe laser 402 and control laser 406 overlaps while passing through atomic vapor cell 404. In one or more examples, the frequency of light from control laser 406 may be dithered (i.e., caused to oscillate) at a specific and pre-determined dither frequency. In one or more examples, the pre-determined control laser dither frequency may be provided by lock-in amplifier 418. In one or more examples, the control laser dither frequency may be less than or equal to 100 Hz, 1 kHz, 10 kHz, 100 kHz, or 1000 kHz. In one or more examples, the control laser dither frequency may be greater than or equal to 100 Hz, 1 kHz, 10 kHz, 100 kHz, or 1000 kHz. In one or more examples, the modulation of the frequency of control laser 406 may cause the energy levels of the atoms in atomic vapor cell 404 to oscillate. This oscillation may impart a modulation to the light emitted by probe laser 402 as it passes through atomic vapor cell 404.

In one or more examples, as the light emitted by the probe laser exits atomic vapor cell 404, it can be directed to photodiode 416 as indicated by arrow 422. In one or more examples, photodiode 416 can convert the received light signal into an electrical signal. In one or more examples, the electrical signal (in the frequency domain) may include a DC component as well as a component at the dither frequency. In one or more examples, the DC signal may indicate the power of probe laser 402 and the dither frequency signal may indicate the frequency at which the light emitted by probe laser 402 is modulated by the oscillations of the energy levels of the atoms in atomic vapor cell 404. In one or more examples, part of the electrical signal may be transmitted from photodiode 416 to signal processing apparatus 410. In one or more examples, signal processing apparatus may be an oscilloscope configured to display data indicating the effects of external electric field 408 on the excited atoms in atomic vapor cell 404. In one or more examples, the signal process apparatus can be optional and is not part of the self-locking process. Instead the signal processing apparatus 410 may be used to provide a user of the system additional information about the effects of the electric field 408. In one or more examples, information provided by signal processing apparatus may comprise information about an electric field strength of electric field 408, a frequency of electric field 408, a wavelength of electric field 408, an energy of electric field 408, or a type of electromagnetic radiation that has been detected in electric field 408 (e.g., microwave radiation, infrared radiation, ultraviolet radiation, gamma radiation, etc.).

Figure 5:
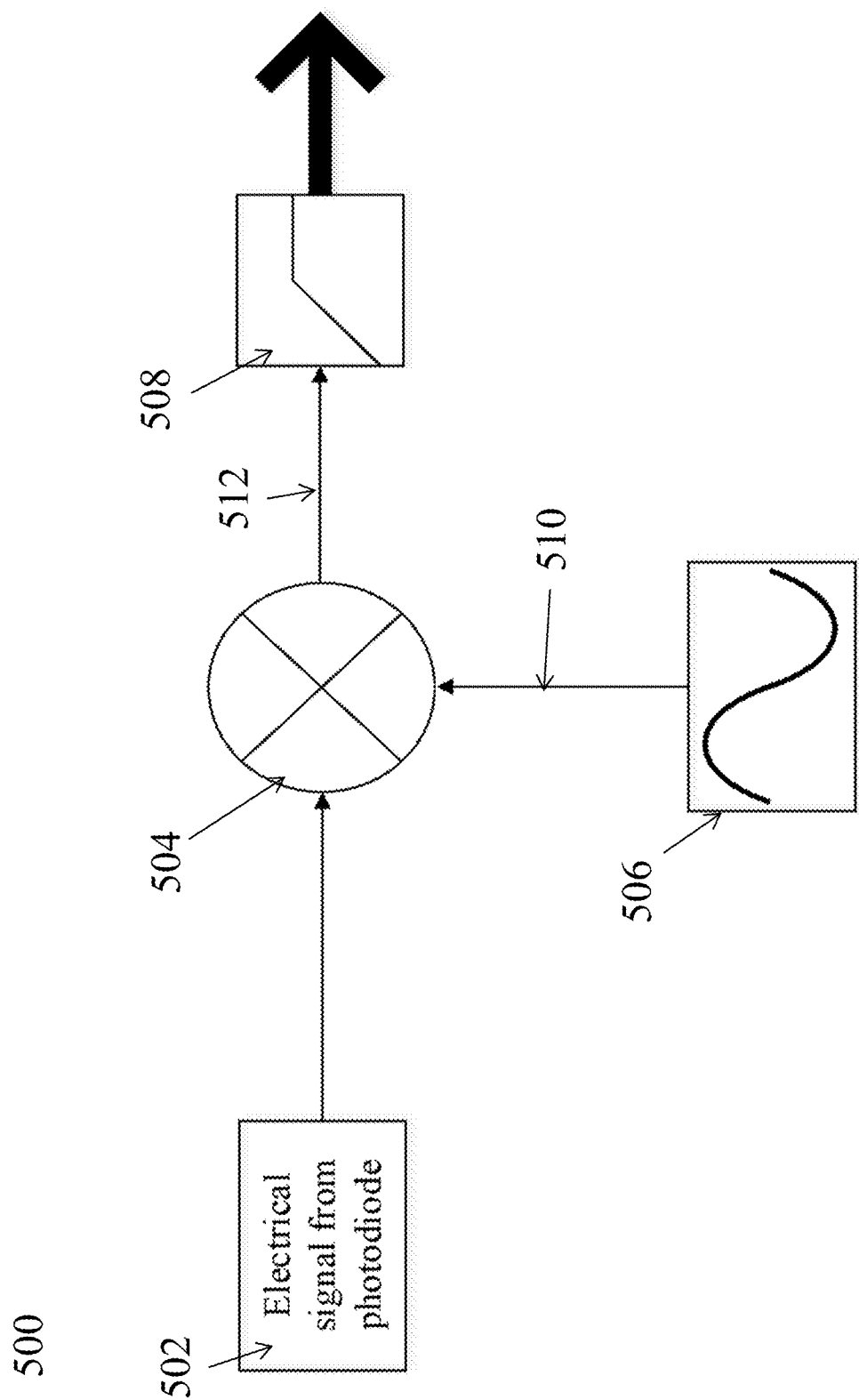
FIG. 5 illustrates an exemplary lock-in amplifier according to one or more examples of the disclosure.

In one or more examples, the electrical signal (or a portion thereof) generated by the photodiode 416 may be transmitted from photodiode 416 to lock-in amplifier 418. In one or more examples, lock-in amplifier 418 may be configured to amplify the component of the electrical signal that exhibits the control laser dither frequency. FIG. 5 illustrates an exemplary lock-in amplifier according to one or more examples of the disclosure. In one or more examples, the system 500 can illustrate an exemplary configuration for lock-in amplifier 418 of FIG. 4. In one or more examples, lock-in amplifier 500 may comprise a multiplier 504, an oscillator 506, and a filter 508. In one or more examples, electrical signal 502 from photodiode 416 may be transmitted to multiplier 504. Multiplier 504 may also receive a reference signal 510 having a predetermined reference frequency from oscillator 506. In one or more examples, the predetermined reference frequency can be set to be equal to the dither frequency of control laser 406. In one or more examples, the predetermined reference frequency may be less than or equal to 100 Hz, 1 kHz, 10 kHz, 100 kHz, or 1000 kHz. In one or more examples, the predetermined reference frequency may be greater than or equal to 100 Hz, 1 kHz, 10 kHz, 100 kHz, or 1000 kHz.

In one or more examples, multiplier 504 may be configured to multiply electrical signal 502 and the reference signal 510. This product may be integrated over a specified period of time to generate an error signal 512. In one or more examples, the error signal 512 may be transmitted to filter 508 which may be configured to discard the error signal 512 if the frequency of the error signal 512 is below a predetermined threshold. This predetermined threshold may be less than or equal to 100 Hz, 50 Hz, 25 Hz, 15 Hz, 10 Hz, 5 Hz, or 1 Hz. In one or more examples, the predetermined threshold may be greater than or equal to 0.5 Hz, 1 Hz, 5 Hz, 10 Hz, or 20 Hz. In one or more examples, the predetermined threshold may be between 0-1 Hz, 0-2 Hz, 0-3 Hz, 0-4 Hz, 0-5 Hz, 0-10 Hz, or 0-25 Hz.

If the laser frequency of the control laser is locked or is stable, then the output of filter 508 may be zero. However, in one or more examples, if the control laser has drifted, then in one or more examples, the output of filter 508 may be non-zero. Thus, in one or more examples, the output of the filter can be used in a feedback loop to adjust the frequency of the control laser until the signal output at filter 508 returns to zero, indicating that the laser is "locked."

In order to ensure that control laser 406 is locked onto the correct frequency, the modulation frequencies of interest may be chosen to be distinct from one another and from any external electric field 408 that self-locking sensor 400 may be used to detect. In one or more examples, the difference between the frequency at which probe laser 402 is modulated and the frequency at which control laser 406 is modulated may be greater than or equal to 1 kHz, 10 kHz, 40 kHz, 60 kHz, 80 kHz, 100 kHz, 1 MHz, or 1 GHz. In one or more examples, the difference between the frequency at which probe laser 402 is modulated and the frequency at which control laser 406 is modulated may be less than or equal to 100 kHz, 10 kHz, 1 kHz, 500 Hz, or 250 Hz. In one or more examples, the difference between the frequency at which probe laser 402 is modulated and the frequency at which control laser 406 is modulated may be between than or equal to 10-50 kHz, 50-100 kHz, 100-250 kHz, 250-500 kHz, or 500 kHz-1 MHz. The modulation frequencies of probe laser 402 and control laser 406 may be chosen based on the order of magnitude of the frequency at which external electric field 408 is modulated. In one or more examples, the modulation frequencies of probe laser 402 and/or control laser 406 may be about one, two, three, four, or five orders of magnitude less than the order of magnitude of the modulation frequency of external electric field 408.

Returning to the example of FIG. 4, in one or more examples, the error signal generated by lock-in amplifier 418 may be transmitted to servo 420. Servo 420 may be a feedback mechanism configured to adjust the frequency of control laser 406 until the error signal from lock-in amplifier 418 is below a predetermined threshold. In one or more examples, servo 420 may adjust the frequency of control laser 406 until the voltage of the error signal from lock-in amplifier is substantially zero.

Figure 6:
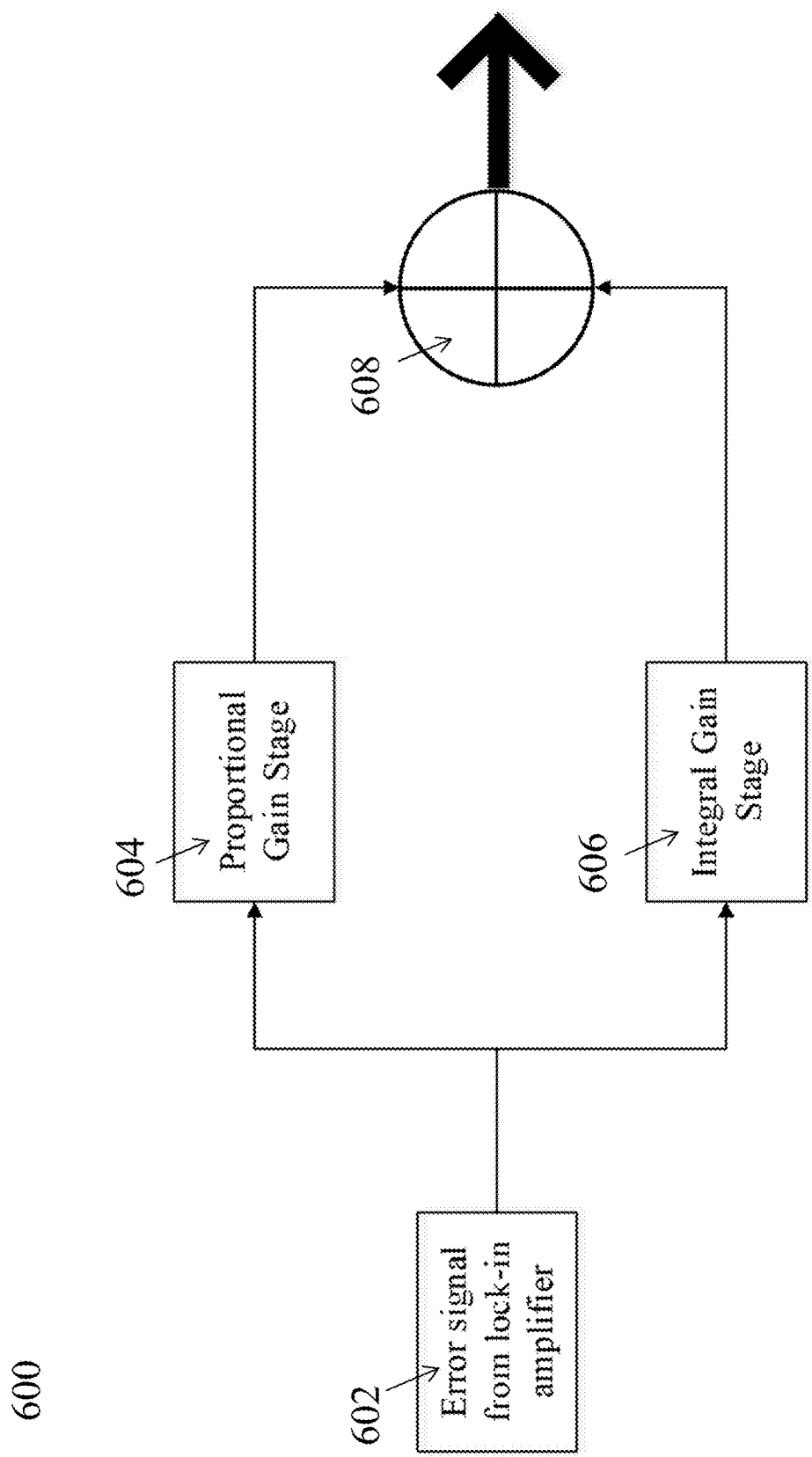
FIG. 6 illustrates an exemplary servo according to one or more examples of the disclosure.

FIG. 6 illustrates an exemplary servo according to one or more examples of the disclosure. In one or more examples, servo 600 (corresponding to servo 420) may receive error signal 602 from lock-in amplifier 418. In one or more examples, error signal 602 may be split into two parts, each of which may be transmitted to a different stages of servo 420, wherein each stage is configured to perform a different analysis on the error signal as described below.

In one or more examples, a first part of error signal 602 may be fed into a proportional gain stage 604 of servo 420. In one or more examples, proportional gain stage 604 may be configured to determine a high speed drift of error signal 602. In one or more examples, proportional gain stage 604 comprises multiplying, using an amplifier, the first part of error signal 602 by a proportional gain. In one or more examples, the amount of proportional gain may be empirically determined by a user of sensor 400. In one or more examples, the proportional gain may amplify the first part of error signal 602 by less than or equal to a factor of 10, a factor of 100, or a factor of 1000. In one or more examples, the proportional gain may amplify the first part of error signal 602 by greater than or equal to a factor of 10, a factor of 100, or a factor of 1000. In one or more examples, the proportional gain stage can be configured such that the correction signal produced by the proportional gain stage is proportional to the error signal input into it at a factor needed to adjust the laser in a manner to counteract the error signal.

In one or more examples, the second part of error signal 602 may be transmitted to an integral gain stage 606 of servo 420. Integral gain stage 606 may determine a low speed drift of error signal 602. In one or more examples, integral gain stage 606 may integrate the second part of error signal 602 over a period of time. The period of time may be determined by a user of sensor 400. In one or more examples, the period of time may be less than or equal to 1 ms, 10 ms, 100 ms, 1 s, 30 s, or 1 min. In one or more examples, the period of time may be greater than or equal to 1 ms, 10 ms, 100 ms, 1 s, 30 s, or 1 min.

In one or more examples, proportional gain stage 604 and integral gain stage 606 may run simultaneously. The output from proportional gain stage 604 and the output from integral gain stage 606 may be transmitted to an adder 608, which may be configured to add the two outputs in order to generate a control signal. In one or more examples, the frequency of control laser 406 may be adjusted based on the control signal output by servo 420.

Figure 7:
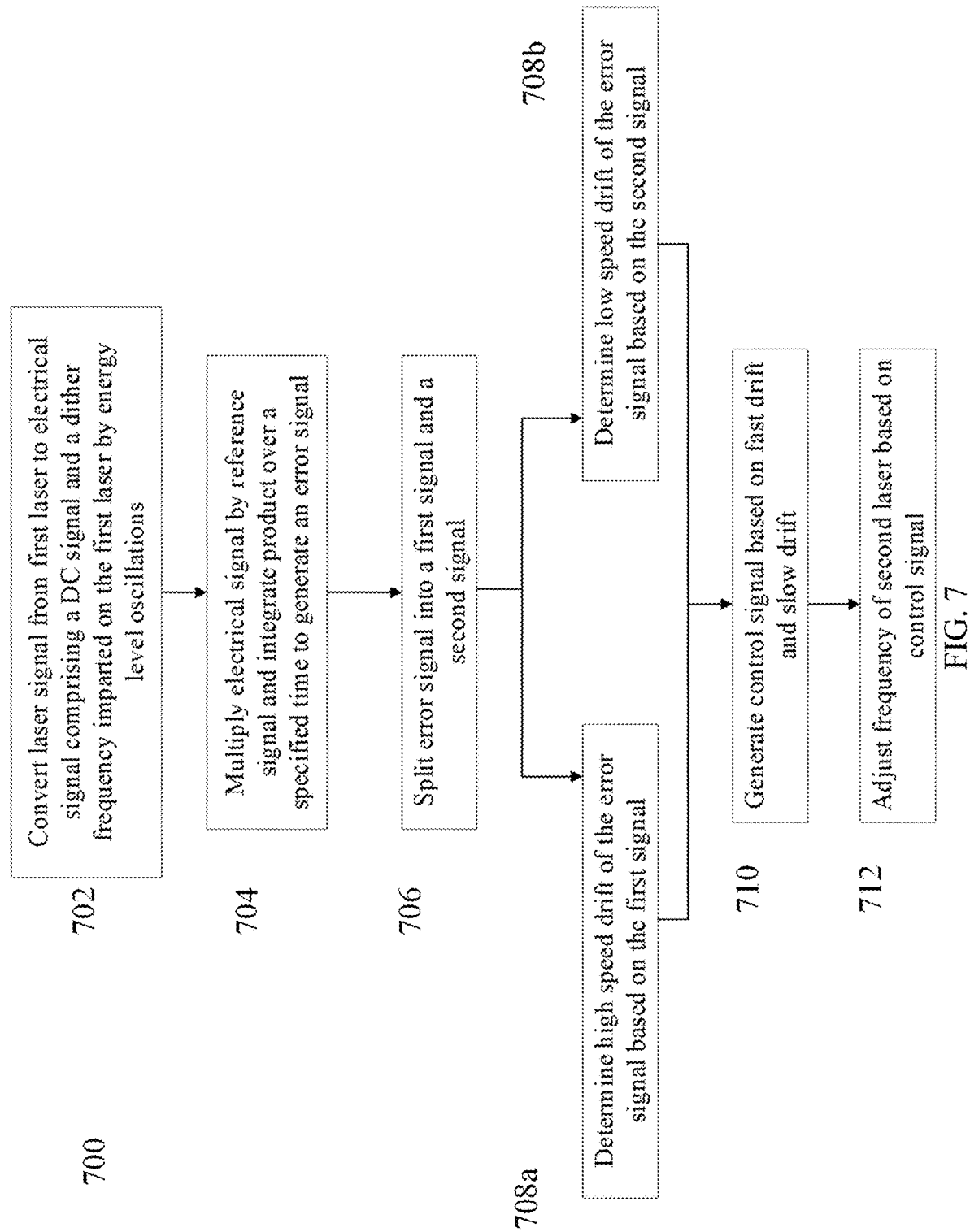
FIG. 7 illustrates an exemplary method of locking a laser according to one or more examples of the disclosure.

FIG. 7 illustrates an exemplary method of locking a laser according to one or more examples. In one or more disclosures, the self-locking method 700 of FIG. 7 can be performed by the system disclosed in FIG. 4. In one or more examples, method 700 may be generally applied to other systems employing multi-photon transitions in atoms. In one or more examples, method 700 may be applied to other systems requiring a locked laser.

In one or more examples, the process 700 can begin at step 702, wherein a laser signal from a first laser may be converted to an electrical signal. In one or more examples, the first laser may be a probe laser similar to probe laser 402 of sensor 400. The laser signal may be received by a photodiode as it exits an atomic vapor cell (e.g., atomic vapor cell 404). The energy levels of the atoms housed in the vapor cell may have been caused to oscillate by a dithering control laser. In one or more examples, the electrical signal may comprise a DC signal and a dither frequency signal. The DC signal may indicate the first laser's power and the dither frequency may be a modulation frequency imparted on the first laser by the oscillation of atomic energy levels. The oscillation of atomic energy levels may be caused by electronically dithering a second laser (e.g., a control laser similar to control laser 406 of sensor 400).

Once the laser signal has been converted to an electrical signal at step 702, the process 700 can move to step 704 wherein the electrical signal may be multiplied by a reference signal. In one or more examples, the product of the electrical signal and the reference signal may then be integrated over a specified period of time. In one or more examples, the result of this integration may be an error signal. In one or more examples, step 704 may be performed by a lock-in amplifier (for example, lock-in amplifier 418 shown in FIGS. 4-5). Step 704 may amplify the component of the electrical signal exhibiting a frequency equal to the dithering frequency of a control laser.

Once the electrical signal has been multiplied by a reference frequency and integrated at step 704, the process 700 can move to step 706 wherein the error signal may be split into a first signal and a second signal. In one or more examples, at step 708a, the first signal may be used to determine a high speed drift of the error signal. In a parallel step 708b, the second signal may be used to determine a low speed drift of the error signal. Information associated with the high speed drift and the low speed drifts may be used to generate a control signal at step 710.

In one or more examples, steps 706-710 may be performed by a feedback mechanism such as a servo (see, e.g., servo 420 shown in FIGS. 4 and 6). In one or more examples, step 708a may comprise a proportional gain stage (e.g., proportional gain stage 604 shown in FIG. 6) wherein the first part of the error signal is amplified by a predetermined proportional gain. In one or more examples, step 708b may comprise an integral gain stage (e.g., integral gain stage 606 shown in FIG. 6) wherein the second part of the error signal is integrated over a predetermined period of time. In one or more examples, generating the control signal at step 710 may involve computing a sum of an output from a proportional gain stage and an output from an integral gain stage.

In one or more examples, after the control signal has been generated at step 710, the process 700 can move to step 712 wherein the control signal can be used to adjust the frequency of a second laser. In one or more examples, the second laser may be a control laser similar to control laser 406 of sensor 400.

As discussed above, in order to correct for frequency shifts, the frequency of the second laser may be continuously adjusted by repeating method 700. In one or more examples, to lock the second laser, method 700 may be repeated for a predetermined time duration, after which the second laser may be allowed to run without being locked. The predetermined time duration may be less than or equal to 600, 480, 360, 240, 120, 30, 5, or 1 seconds. In one or more examples, the predetermined time duration may be greater than or equal to 600, 540, 420, 300, 180, 60, 10, or 0.5 seconds. In one or more examples, the predetermined time duration may be between 540-600, 480-540, 420-480, 360-420, 300-360, 240-300, 180-240, 120-180, 60-120, 30-60, 10-30, 5-10, or 0-5 seconds. In one or more examples, after the second laser has been locked and then allowed to run free, method 700 may be restarted in order to re-lock the second laser. In one or more examples, method 700 may be repeated between 1-10, 10-20, 20-50, 50-100, 100-500, or 500-1000 times during a given period. In one or more examples, method 700 may be repeated more than 1000 times during a given period. The foregoing "stroboscopic" approach may allow increase the quality of data being collected by a sensor using a self-locking method such as method 700.

The self-locking Rydberg atom electric field sensor described in FIG. 4 is an exemplary implementation of self-locking methods such as method 700 shown in FIG. 7. The self-locking systems and methods described in the present disclosure may be implemented in other types of quantum sensors that harness multi-photon transitions. In one or more examples, the self-locking systems and methods may be used to lock lasers for other applications other than quantum sensing, for example in quantum computing or communications. In one or more examples, the self-locking systems and methods may be used to control atomic transitions between two or more excited states, rather than to control atomic transitions between a ground state and a single excited state (e.g., a Rydberg state).

Figure 8:
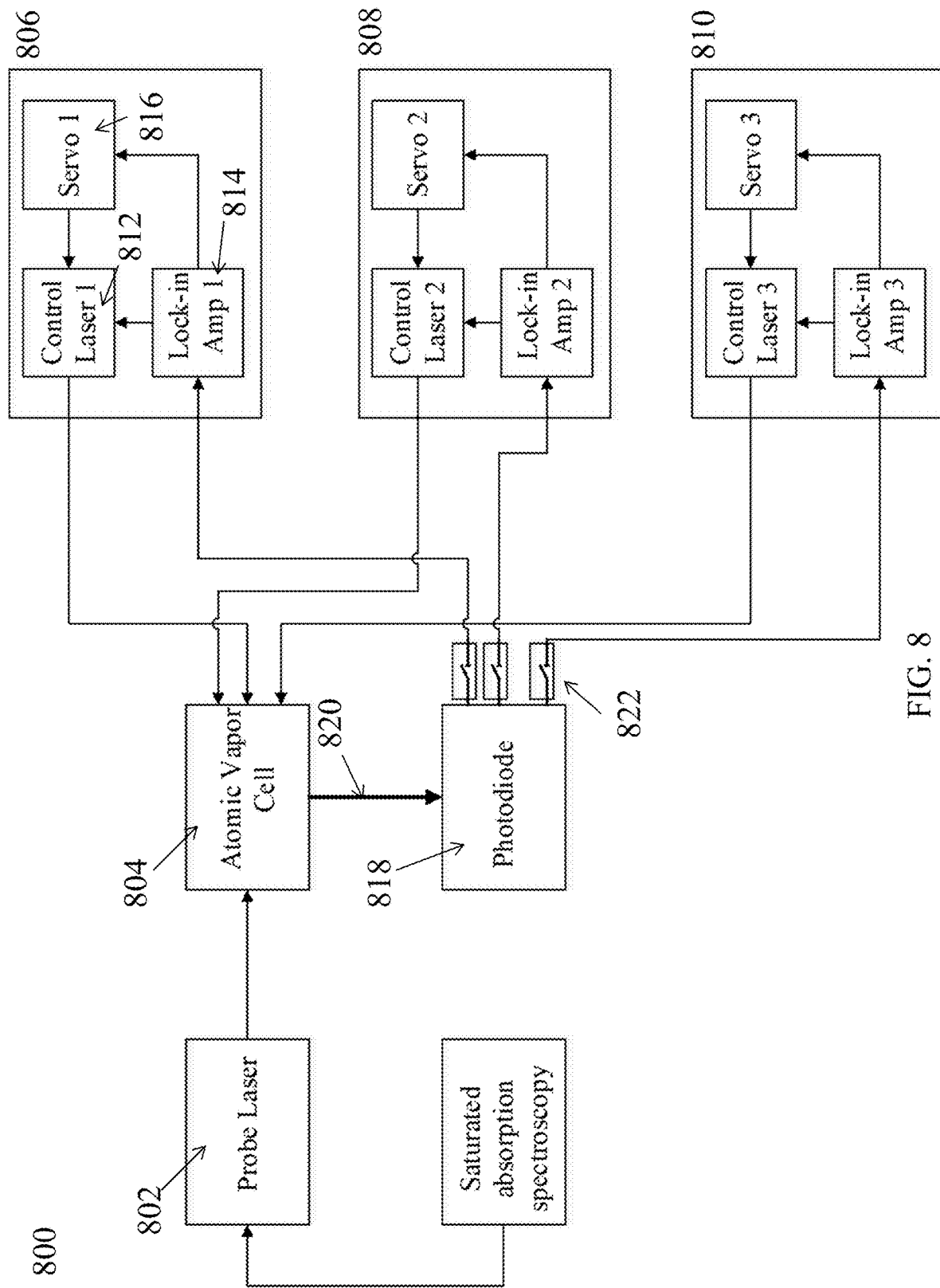
FIG. 8 illustrates an exemplary self-locking system for controlling atomic transitions between multiple high energy states according to one or more examples of the disclosure.

FIG. 8 illustrates an exemplary self-locking laser system for controlling atomic transitions between three high energy states according to one or more examples of the disclosure. Specifically, FIG. 8 illustrates an exemplary self-locking laser system 800 configured to control atomic transitions between three high energy states. As shown, in one or more examples, system 800 may comprise a probe laser 802, an atomic vapor cell 804, three control laser systems 806, 808, and 810, and a photodiode 818. In one or more examples, systems such as system 800 may be implemented in quantum sensors which harness atomic transitions between two or more excited states.

In one or more examples, probe laser 802 may be configured to excite atoms housed in atomic vapor cell 804 from a ground state to an intermediate excited state. In one or more examples, the frequency of probe laser 802 may be stabilized using saturated absorption spectroscopy techniques. For further discussion of probe lasers such as probe laser 802, see the description of probe laser 402 shown in FIG. 4 and/or the description of probe laser 302 shown in FIG. 3.

In one or more examples, a first control laser system 806 may be used to excite atoms from the intermediate excited state to a first high energy state. In one or more examples, control laser system 806 may comprise a first control laser 812, a first lock-in amplifier 814, and a servo 816. In one or more examples, control laser 812, lock-in amplifier 814, and servo 816 may be similar to control laser 406, lock-in amplifier 418, and servo 420 shown in FIG. 4.

In one or more examples, after the atoms in atomic vapor cell 804 have been excited to an intermediate excited state by probe laser 802, control laser 812 may transmit light through atomic vapor cell 804 so that it overlaps light from probe laser 802 within atomic vapor cell 804. In one or more examples, the frequency of light emitted by control laser 812 may be less than or equal to $3 \times 10^{20}$, $3 \times 10^{17}$, $3 \times 10^{13}$, $3 \times 10^{11}$, $3 \times 10^{7}$, $3 \times 10^{5}$, or $3 \times 10^{2}$ Hz. In one or more examples, the frequency of light emitted by control laser 406 may be greater than or equal to $3 \times 10^{18}$, $3 \times 10^{15}$, $3 \times 10^{12}$, $3 \times 10^{9}$, $3 \times 10^{6}$, $3 \times 10^{3}$, or 3 Hz. In one or more examples, the frequency of light emitted by control laser 406 may be between $0-3 \times 10^{2}$ Hz, $3 \times 10^{2}$ Hz-$3 \times 10^{6}$, $3 \times 10^{6}$-$3 \times 10^{9}$, $3 \times 10^{9}$-$3 \times 10^{12}$, $3 \times 10^{12}$-$3 \times 10^{17}$, or $3 \times 10^{17}$-$3 \times 10^{20}$ Hz. The frequency of light from control laser 812 may be dithered (i.e., caused to oscillate) at a specific and pre-determined dither frequency. In one or more examples, the dither frequency of control laser 812 may be less than or equal to 100 Hz, 1 kHz, 10 kHz, 100 kHz, or 1000 kHz. In one or more examples, the control laser dither frequency may be greater than or equal to 100 Hz, 1 kHz, 10 kHz, 100 kHz, or 1000 kHz. The pre-determined control laser dither frequency may be provided by lock-in amplifier 814. The modulation of the frequency of control laser 812 may cause the energy levels of the atoms in atomic vapor cell 804 to oscillate. This oscillation may impart a modulation to the light emitted by probe laser 802 as it passes through atomic vapor cell 804.

In one or more examples, as the light emitted by probe laser 802 exits atomic vapor cell 804, it can be directed to photodiode 818 as indicated by arrow 820. In one or more examples, photodiode 818 can convert the received light signal into an electrical signal. In one or more examples, the electrical signal (in the frequency domain) may include a DC component as well as a component at the dither frequency. In one or more examples, the DC signal may indicate the power of probe laser 802 and the dither frequency signal may indicate the frequency at which the light emitted by probe laser 802 is modulated by the oscillations of the energy levels of the atoms in atomic vapor cell 804.

In one or more examples, the electrical signal generated by photodiode 818 may be transmitted to lock-in amplifier 814. In one or more examples, lock-in amplifier 814 may be configured to generate an error signal that indicates the stability of the frequency of control laser 812. For further discussion of lock-in amplifiers and the generation of the error signal, see the description of FIG. 5 and/or the description of step 704 of method 700 shown in FIG. 7. In one or more examples, after the error signal is generated by lock-in amplifier 814, it may be transmitted to servo 816. Servo 816 may be configured to generate a control signal based on a high speed drift of the error signal and a low speed drift of the error signal. The control signal generated by servo 816 may be used to adjust the frequency of control laser 812. For further discussion of servos and the generation of the control signal, see the description of FIG. 6 and/or the description of steps 706-712 of method 700 shown in FIG. 7.

As described above, the first control laser system 806 may be configured to lock the frequency of control laser 812. After control laser 812 is locked, atoms in atomic vapor cell 804 may be excited from the intermediate excited state to the first high energy state. The second control laser system 808 and the third control laser system 810 may be configured to excite atoms in atomic vapor cell 804 from a first high energy state to a second high energy state and from a second high energy state to a third high energy state, respectively. In some embodiments, sensor 800 may comprise a plurality of switches 822 which may control which control laser system of control laser systems 806, 808, and 810 receives signals from photodiode 818 at a given time. The foregoing process described with respect to the first control laser system 806 may be repeated with control laser system 808 and control laser system 810 to achieve the aforementioned atomic transitions. In one or more examples, system 800 may be modified to include any number of control laser systems in order to achieve any desired number of atomic transitions.

Figure 9:
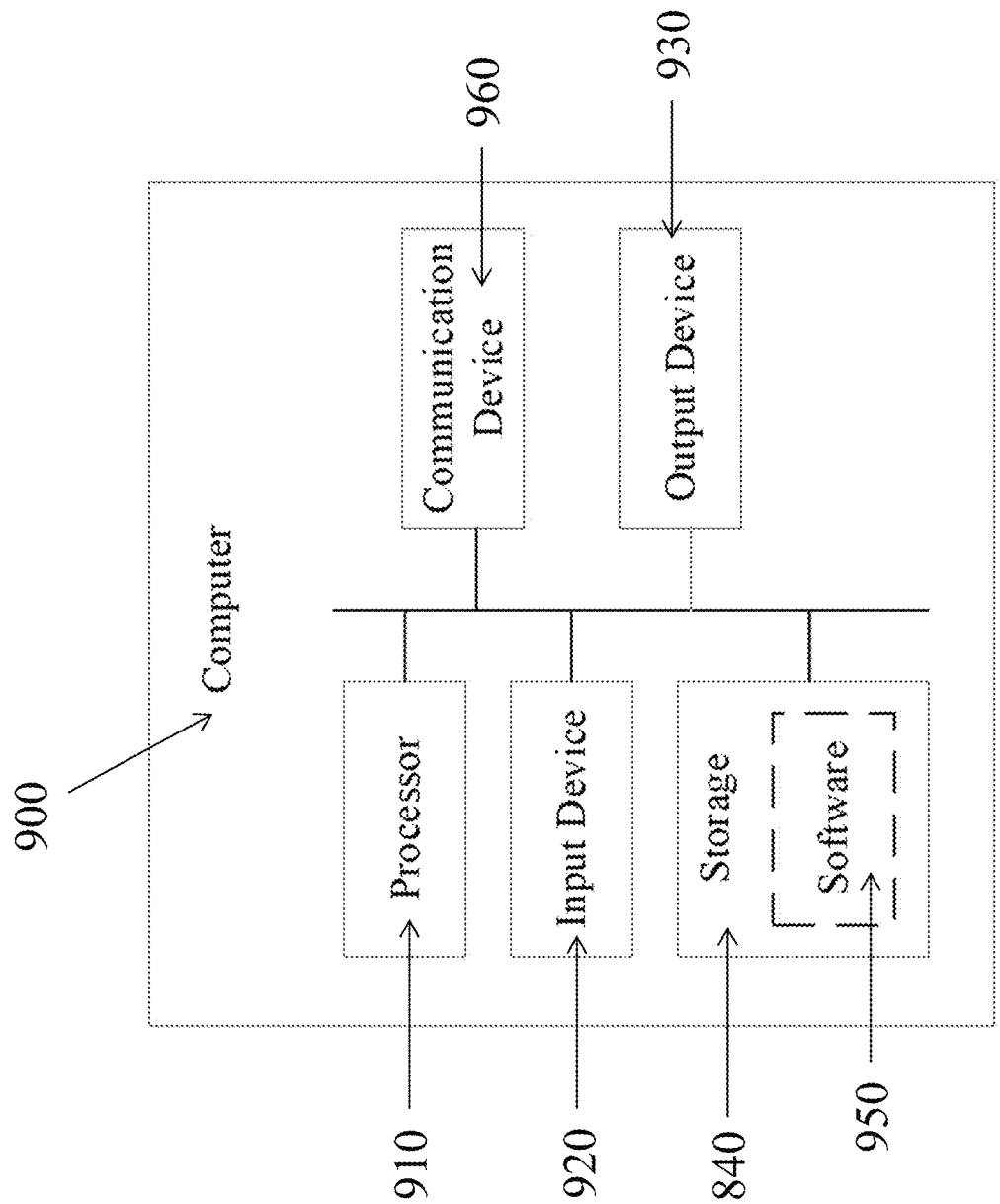
FIG. 9 illustrates an exemplary computing system, according to examples of the disclosure.

In one or more examples, a self-locking laser system may comprise a computer configured to control one or more features of the system. FIG. 9 illustrates an exemplary computing system, according to examples of the disclosure. In one or more examples, computer 900 may be involved in executing one or more of the methods described herein, such as self-locking method 700 shown in FIG. 7. Computer 900 can be a host computer connected to a network. Computer 900 can be a client computer or a server. As shown in FIG. 9, computer 900 can be any suitable type of microprocessor-based device, such as a personal computer, workstation, server, or handheld computing device, such as a phone or tablet. The computer can include, for example, one or more of processor 910, input device 920, output device 930, storage 940, and communication device 860. Input device 920 and output device 930 can correspond to those described above and can either be connectable or integrated with the computer.

Input device 920 can be any suitable device that provides input, such as a touch screen or monitor, keyboard, mouse, or voice-recognition device. Output device 930 can be any suitable device that provides an output, such as a touch screen, monitor, printer, disk drive, or speaker.

Storage 940 can be any suitable device that provides storage, such as an electrical, magnetic, or optical memory, including a random access memory (RAM), cache, hard drive, CD-ROM drive, tape drive, or removable storage disk. Communication device 860 can include any suitable device capable of transmitting and receiving signals over a network, such as a network interface chip or card. The components of the computer can be connected in any suitable manner, such as via a physical bus or wirelessly. Storage 940 can be a non-transitory computer-readable storage medium comprising one or more programs, which, when executed by one or more processors, such as processor 910, cause the one or more processors to execute methods described herein.

Software 950, which can be stored in storage 940 and executed by processor 910, can include, for example, the programming that embodies the functionality of the present disclosure (e.g., as embodied in the systems, computers, servers, and/or devices as described above). In one or more examples, software 950 can include a combination of servers such as application servers and database servers.

Software 950 can also be stored and/or transported within any computer-readable storage medium for use by or in connection with an instruction execution system, apparatus, or device, such as those described above, that can fetch and execute instructions associated with the software from the instruction execution system, apparatus, or device. In the context of this disclosure, a computer-readable storage medium can be any medium, such as storage 940, that can contain or store programming for use by or in connection with an instruction execution system, apparatus, or device.

Software 950 can also be propagated within any transport medium for use by or in connection with an instruction execution system, apparatus, or device, such as those described above, that can fetch and execute instructions associated with the software from the instruction execution system, apparatus, or device. In the context of this disclosure, a transport medium can be any medium that can communicate, propagate, or transport programming for use by or in connection with an instruction execution system, apparatus, or device. The transport-readable medium can include but is not limited to, an electronic, magnetic, optical, electromagnetic, or infrared wired or wireless propagation medium.

Computer 900 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Computer 900 can implement any operating system suitable for operating on the network. Software 950 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for the purpose of explanation, has been described with reference to specific embodiments and/or examples. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

Any of the systems, methods, techniques, and/or features disclosed herein may be combined, in whole or in part, with any other systems, methods, techniques, and/or features disclosed herein.

The invention claimed is:

1. A Rydberg atomic sensor configured to automatically lock a control laser of the sensor, the sensor comprising:
   an atomic vapor cell configured to store one or more atoms;
   a first laser configured to excite the one or more atoms in the atomic vapor cell to a first energy state;
   a second laser configured to excite the one or more atoms in the atomic vapor cell from the first energy state to a second energy state, wherein the second energy state is higher than the first energy state, and wherein a laser light generated by the second laser is dithered at a pre-determined frequency;
   a photodiode configured to receive light from the atomic vapor cell and convert the received light into an electrical signal;
   a lock-in amplifier configured to receive the electrical signal from the photo diode, and configured to receive a reference oscillation frequency signal, wherein the lock-in amplifier generates an error signal based on the electrical signal received from the photo diode and the received reference oscillation frequency; and
   a servo configured to receive the generated error signal from the lock-in amplifier and adjust a frequency of the second laser based on the received error signal.

2. The sensor of claim 1, wherein the lock-in amplifier comprises:
   a multiplier configured to multiply the received electrical signal from the photo diode and the received oscillation frequency signal; and
   a filter configured to filter the output of the multiplier so as to generate the error signal.

3. The sensor of claim 2, wherein the lock-in amplifier is configured to generate an error signal if the received oscillation frequency signal and the predetermined frequency of the second laser dither are not equal to one another.

4. The sensor of claim 3, wherein the lock-in amplifier is configured to produce substantially no error signal if the received oscillation frequency signal and the predetermined frequency of the second laser dither are substantially equal to one another.

5. The sensor of claim 1, wherein the servo comprises:
   a proportional gain stage, wherein the proportional gain stage is configured amplify the received error signal by a predetermined factor; and
   an integral gain stage, wherein the integral gain stage is configured to integrate the received error signal over a predetermined time period.

6. The sensor of claim 5, wherein the servo comprises an adder configured to add an output of the proportional gain stage and an output of the integral gain stage and generate a control signal.

7. The sensor of claim 6, wherein the control signal generated by the servo is configured to adjust a frequency of the second laser based on a voltage of the control signal generated by the servo.

8. A method for automatically locking a control laser in a Rydberg atomic sensor, the method comprising:
   directing light from a first laser to an atomic vapor cell configured to store one or more atoms, wherein the first laser is configured to excite the one or more atoms in the vapor cell to a first energy state;
   directing light from a second laser to the atomic vapor cell, wherein the second laser is configured to excite the one or more atoms in the atomic vapor cell from the first energy state to a second energy state, wherein the second energy state is higher than the first energy state, and wherein a laser light generated by the second laser is dithered at a pre-determined frequency;
   receiving light from the atomic vapor cell at a photodiode, wherein the photo diode is to configured receive light from the atomic vapor cell and convert the received light into an electrical signal;
   receiving the electrical signal generated by the photodiode at a lock-in amplifier configured to receive the electrical signal from the photo diode, and configured to receive a reference oscillation frequency signal, wherein the lock-in amplifier generates an error signal based on the electrical signal received from the photo diode and the received reference oscillation frequency; and
   adjusting a frequency of the second laser using a servo configured to receive the generated error signal from the lock-in amplifier and adjust the frequency of the second laser based on the received error signal.

9. The method of claim 8, wherein lock-in amplifier comprises:
   a multiplier configured to multiply the received electrical signal from the photo diode and the received oscillation frequency signal; and
   a filter configured to filter the output of the multiplier so as to generate the error signal.

10. The method of claim 9, wherein the lock-in amplifier is configured to generate an error signal if the received oscillation frequency signal and the predetermined frequency of the second laser dither are not equal to one another.

11. The method of claim 10, wherein the lock-in amplifier is configured to produce substantially no error signal if the received oscillation frequency signal and the predetermined frequency of the second laser dither are substantially equal to one another.

12. The method of claim 8, wherein the servo comprises:
a proportional gain stage, wherein the proportional gain stage is configured to amplify the received error signal by a predetermined factor; and
an integral gain stage, wherein the integral gain stage is configured to integrate the received error signal over a predetermined time period.

13. The method of claim 12, wherein the servo comprises an adder configured to add an output of the proportional gain stage and an output of the integral gain stage and generate a control signal.

14. The method of claim 13, wherein the control signal generated by the servo is configured to adjust a frequency of the second laser based on a voltage of the control signal generated by the servo.

15. A non-transitory computer readable storage medium storing one or more programs for automatically locking a control laser in a Rydberg atomic sensor, the programs for execution by one or more processors of an electronic device that when executed by the device, cause the device to:
direct light from a first laser to an atomic vapor cell configured to store one or more atoms, wherein the first laser is configured to excite the one or more atoms in the vapor cell to a first energy state;
direct light from a second laser to the atomic vapor cell, wherein the second laser is configured to excite the one or more atoms in the atomic vapor cell from the first energy state to a second energy state, wherein the second energy state is higher than the first energy state, and wherein a laser light generated by the second laser is dithered at a pre-determined frequency;
receive light from the atomic vapor cell at a photodiode, wherein the photo diode is to configured receive light from the atomic vapor cell and convert the received light into an electrical signal;
receive the electrical signal generated by the photodiode at a lock-in amplifier configured to receive the electrical signal from the photo diode, and configured to receive a reference oscillation frequency signal, wherein the lock-in amplifier generates an error signal based on the electrical signal received from the photo diode and the received reference oscillation frequency; and
adjust a frequency of the second laser using a servo configured to receive the generated error signal from the lock-in amplifier and adjust the frequency of the second laser based on the received error signal.

16. The non-transitory computer readable storage medium of claim 15, wherein lock-in amplifier comprises:
a multiplier configured to multiply the received electrical signal from the photo diode and the received oscillation frequency signal; and
a filter configured to filter the output of the multiplier so as to generate the error signal.

17. The non-transitory computer readable storage medium of claim 16, wherein the lock-in amplifier is configured to generate an error signal if the received oscillation frequency signal and the predetermined frequency of the second laser dither are not equal to one another.

18. The non-transitory computer readable storage medium of claim 17, wherein the lock-in amplifier is configured to produce substantially no error signal if the received oscillation frequency signal and the predetermined frequency of the second laser dither are substantially equal to one another.

19. The non-transitory computer readable storage medium of claim 15, wherein the servo comprises:
a proportional gain stage, wherein the proportional gain stage is configured amplify the received error signal by a predetermined factor; and
an integral gain stage, wherein the integral gain stage is configured to integrate the received error signal over a predetermined time period.

20. The non-transitory computer readable storage medium of claim 19, wherein the servo comprises an adder configured to add an output of the proportional gain stage and an output of the integral gain stage and generate a control signal.

21. The non-transitory computer readable storage medium of claim 20, wherein the control signal generated by the servo is configured to adjust a frequency of the second laser based on a voltage of the control signal generated by the servo.

22. The sensor of claim 1, wherein the first laser is distinct from the second laser.

* * * * *